(12) United States Patent
Wang et al.

(10) Patent No.: US 9,272,900 B2
(45) Date of Patent: Mar. 1, 2016

(54) NANOSTRUCTURES AND METHODS OF MAKING THE SAME

(75) Inventors: Shih-Yuan Wang, Palo Alto, CA (US); Michael Renne Ty Tan, Menlo Park, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 1025 days.

(21) Appl. No.: 12/864,205

(22) PCT Filed: Jan. 30, 2008

(86) PCT No.: PCT/US2008/052476
§ 371 (c)(1),
(2), (4) Date: Jul. 22, 2010

(87) PCT Pub. No.: WO2009/096961
PCT Pub. Date: Aug. 6, 2009

(65) Prior Publication Data
US 2010/0295018 A1    Nov. 25, 2010

(51) Int. Cl.
*H01L 29/06* (2006.01)
*B81C 1/00* (2006.01)
*B82Y 10/00* (2011.01)
(Continued)

(52) U.S. Cl.
CPC .............. *B81C 1/00142* (2013.01); *B82Y 10/00* (2013.01); *H01L 29/068* (2013.01); *H01L 29/0665* (2013.01); *H01L 29/0673* (2013.01); *H01L 29/0676* (2013.01); *H01L 31/035281* (2013.01); *H01L 31/105* (2013.01); *B81C 2201/0171* (2013.01); *H01L 2924/0002* (2013.01); *Y02E 10/50* (2013.01)

(58) Field of Classification Search
CPC ............ H01L 29/0665; H01L 29/0673; H01L 29/0676; H01L 29/068; H01L 31/035281; H01L 31/105; H01L 2924/0002; H01L 2924/00; B82Y 10/00; B81C 1/00142; B81C 2201/0171; Y02E 10/50
USPC ........ 257/14, E21.09, E29.166; 438/478, 652
See application file for complete search history.

(56) References Cited

U.S. PATENT DOCUMENTS

| 5,296,719 A | 3/1994 | Hirai et al. |
| 6,882,051 B2 | 4/2005 | Majumdar et al. |
| 7,051,945 B2 | 5/2006 | Empedocles et al. |

(Continued)

FOREIGN PATENT DOCUMENTS

| FR | 2902237 A1 | 12/2007 |
| JP | 1996-204200 | 8/1996 |

(Continued)

OTHER PUBLICATIONS

International Preliminary Report on Patentability received in PCT Application No. PCT/US2008/052476, Aug. 12, 2010, 7 pages.

(Continued)

*Primary Examiner* — Vongsavanh Sengdara
(74) *Attorney, Agent, or Firm* — Dierker & Associates, P.C.

(57) ABSTRACT

A nanostructure includes a highly conductive microcrystalline layer, a bipolar nanowire, and another layer (18, 30). The highly conductive microcrystalline layer includes a microcrystalline material and a metal. The bipolar nanowire has one end attached to the highly conductive microcrystalline layer and another end attached to the other layer.

13 Claims, 2 Drawing Sheets

(51) Int. Cl.
    *H01L 31/0352*    (2006.01)
    *H01L 31/105*    (2006.01)

(56)  References Cited

U.S. PATENT DOCUMENTS

| | | | |
|---|---|---|---|
| 7,208,094 | B2 | 4/2007 | Islam et al. |
| 7,233,041 | B2 | 6/2007 | Duan et al. |
| 7,235,475 | B2 | 6/2007 | Kamins |
| 7,754,600 | B2 | 7/2010 | Kobayashi |
| 8,183,566 | B2 | 5/2012 | Kobayashi |
| 2002/0155691 | A1* | 10/2002 | Lee .............. H01L 21/28575 438/604 |
| 2005/0194598 | A1* | 9/2005 | Kim .............. H01L 33/08 257/79 |
| 2005/0227391 | A1 | 10/2005 | Jin et al. |
| 2005/0235904 | A1 | 10/2005 | Lee et al. |
| 2006/0207647 | A1 | 9/2006 | Tsakalakos et al. |
| 2006/0240588 | A1 | 10/2006 | Conley, Jr. et al. |
| 2006/0246688 | A1* | 11/2006 | Sekiguchi .......... H01L 21/76251 438/458 |
| 2006/0255481 | A1 | 11/2006 | Pan et al. |
| 2007/0131937 | A1 | 6/2007 | Oh |
| 2007/0145356 | A1* | 6/2007 | Amlani .............. B82Y 10/00 257/40 |
| 2007/0202674 | A1 | 8/2007 | Cohen et al. |
| 2007/0228421 | A1 | 10/2007 | Shioya et al. |
| 2008/0111144 | A1* | 5/2008 | Fichtenbaum ........ B82Y 20/00 257/96 |
| 2010/0028633 | A1* | 2/2010 | O'Rourke .......... B82Y 10/00 428/210 |

FOREIGN PATENT DOCUMENTS

| | | |
|---|---|---|
| JP | 2007-184566 | 7/2007 |
| JP | 2010-520618 | 6/2010 |
| JP | 2010-520619 | 6/2010 |
| KR | 1020040069492 | 8/2004 |
| KR | 1020050074703 | 7/2005 |
| KR | 1020050104034 | 11/2005 |

OTHER PUBLICATIONS

International Search Report & Written Opinion received in PCT Application No. PCT/US2008/052476, Feb. 23, 2009, 13 pages.

Kikuchi, A. et al. "InGaN/GaN Multiple Quantum Disk Nanocolumn Light-Emitting Diodes Grown on (111) Si Substrate," Japanese Journal of Applied Physics 43.12A, 2004, pp. L1524-L1526.

Li, Y. et al.,"Nanowire Electronic and Optoelectronic Devices, " Materials Today 9.10, 2006, pp. 18-27.

Mieszawska, A.J. et al., "The Synthesis and Fabrication of OneDimensional Nanoscale Heterojunctions," Small 3.5, 2007, pp. 722-756.

* cited by examiner

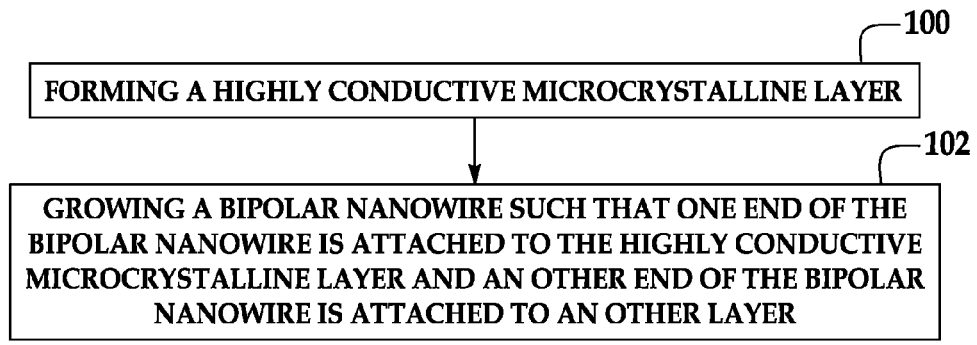
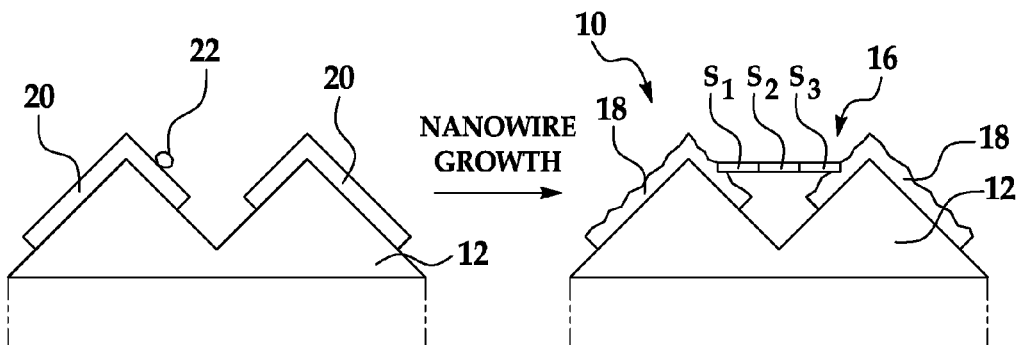
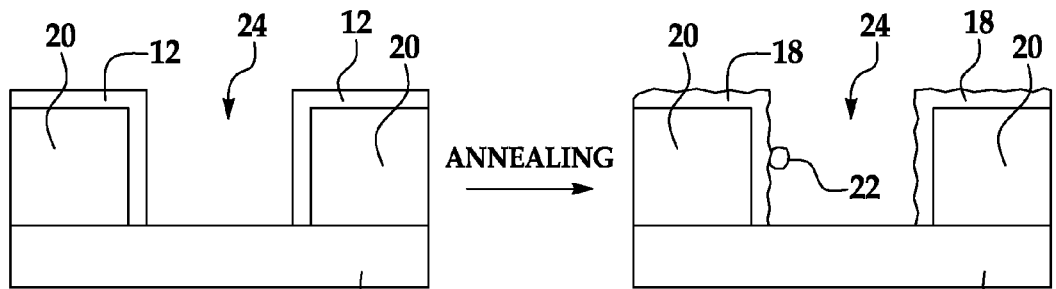
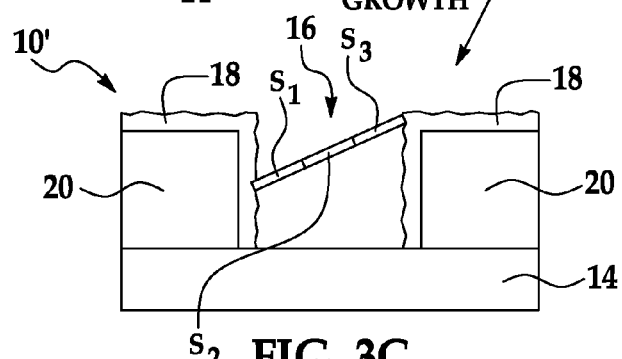

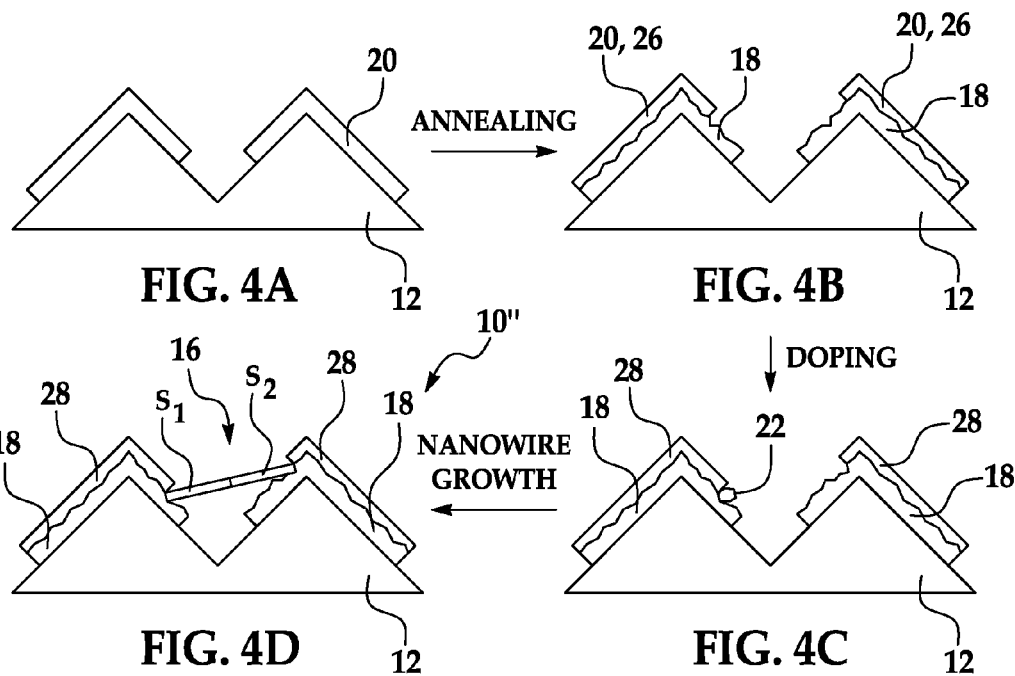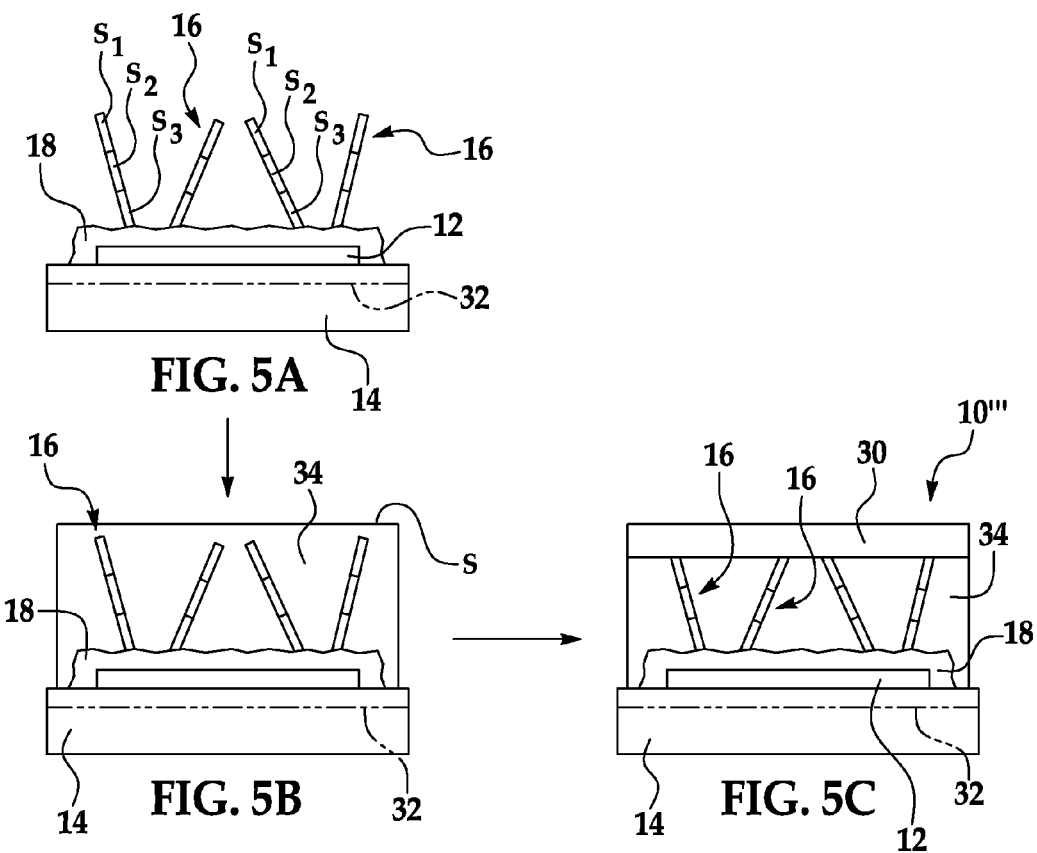

NANOSTRUCTURES AND METHODS OF MAKING THE SAME

BACKGROUND

The present disclosure relates generally to nanostructures and methods of making the same.

Since the inception of semiconductor technology, a consistent trend has been toward the development of smaller device dimensions and higher device densities. As a result, nanotechnology has seen explosive growth and generated considerable interest. Nanotechnology is centered on the fabrication and application of nano-scale structures, or structures having dimensions that are often 5 to 100 times smaller than conventional semiconductor structures. Nanowires are included in the category of nano-scale structures.

Nanowires are wire-like structures having at least one linear dimension (e.g., diameter) ranging from about 1 nm to about 800 nm. It is to be understood that the diameter of the nanowire may also vary along the length (e.g., from several hundred nanometers at the base to a few nanometers at the tip). Nanowires are suitable for use in a variety of applications, including functioning as conventional wires for interconnection applications or as semiconductor devices. Nanowires are also the building blocks of many potential nano-scale devices, such as nano-scale field effect transistors (FETs), p-n diodes, light emitting diodes (LEDs) and nanowire-based sensors, to name a few.

BRIEF DESCRIPTION OF THE DRAWINGS

Features and advantages of embodiments of the present disclosure will become apparent by reference to the following detailed description and drawings, in which like reference numerals correspond to the same or similar, though perhaps not identical, components. For the sake of brevity, reference numerals having a previously described function may or may not be described in connection with subsequent drawings in which they appear.

FIG. 1 is a flow diagram depicting an embodiment of a method for forming an embodiment of a nanostructure;

FIGS. 2A and 2B schematically depict an embodiment of the method for forming an embodiment of the nanostructure;

FIGS. 3A through 3C schematically depict another embodiment of the method for forming another embodiment of the nanostructure;

FIGS. 4A through 4D schematically depict yet another embodiment of the method for forming an yet another embodiment of the nanostructure; and FIGS. 5A through 5C schematically depict still another embodiment of the method for forming an embodiment of the nanostructure.

DETAILED DESCRIPTION

Embodiments of the nanostructure disclosed herein advantageously include one or more bipolar nanowires having at least one end attached to a highly conductive microcrystalline layer.

As used herein, the term "bipolar nanowire" refers to a nanowire having segments of at least two different conductivity types. Generally, these doped segments extend a predetermined distance along the length of the nanowire, and beyond the ends that contact, for example, the highly conductive microcrystalline layer. The nanowire may be a p-n or n-p nanowire. Such nanowire nanostructures may be particularly suitable for use as emitters and photodetectors. The nanowires disclosed herein may also have one or more heterojunctions therein (i.e., a junction at which two different materials meet). The nanowire may also include multiple p-type or n-type segments throughout the length of the nanowire, and/or an undoped intrinsic semiconductor region (e.g., p-i-n or n-i-p). Non-limiting examples of multi-segmented nanowires include $p^+$-p-n-$n^+$ or $p^+$-p-i-n-$n^+$, where the "$p^+$" or "$n^+$" indicates a higher level of doping than porn alone. In some instances, it may be desirable to include the higher doped levels at areas where the nanowire forms a contact with the highly conductive microcrystalline layer. For photodiodes, a $p^+$-p-i-n-$n^+$ nanowire may be particularly suitable, where the higher doped levels form an ohmic contact with respective highly conductive microcrystalline layers.

Furthermore, the bipolar nanowire may include quantum wells or heterostructures formed therein. A p-i-n or n-i-p nanowire nanostructure and nanostructures having quantum wells or heterostructures formed therein may be particularly suitable for use as photodetectors and emitters. In a non-limiting example, a heterostructure and quantum wells may be formed by growing an InP-InGaAsP-InP-InGaAsP-InP nanowire, where each InP-InGaAsP-InP portion acts as a quantum well when the length of the InGaAsP segment is about 30 nm. A heterostructure may also be formed, for example, when the InGaAsP segment is larger (i.e., has a length that is greater than or equal to 100 nm).

Also as used herein, the term "highly conductive" when referring to the microcrystalline layer means that the layer has a resistivity ranging from about 1 µohm/cm to about 100 µohms/cm. In some instances, the resistivity ranges from about 1 µohm/cm to about 10 µohms/cm, and in other instances the resistivity is less than 50 µohms/cm. Generally, the lower the resistivity, the more conductive the microcrystalline layer is.

In embodiments of the methods disclosed herein, the nanowires are generally doped during growth. In some instances, the metal material used to form the highly conductive microcrystalline layer is sufficient to provide desirable levels of conductivity; and as such, additional processing steps for doping the highly conductive microcrystalline layer may be avoided.

Referring now to FIG. 1, embodiments of the method generally include forming a highly conductive microcrystalline layer, as shown at reference numeral 100, and growing a bipolar nanowire such that one end of the bipolar nanowire is attached to the highly conductive microcrystalline layer and another end is attached to another layer, as shown at reference numeral 102. It is to be understood that more detailed aspects of the method shown in FIG. 1 and the resulting nanostructures are discussed further in reference to the other figures.

FIGS. 2A and 2B together depict an embodiment of the method disclosed herein. In this embodiment, a metal material/layer 12 is established on a substrate 14. It is to be understood that any suitable substrate 14 may be used. The substrate 14 may be transparent or opaque, depending, at least in part, on the desirable end use of the device 10 (shown in FIG. 2B). More specific examples of suitable substrate materials include, but are not limited to quartz, silicon wafers metal foils (e.g., stainless steel foils), glass, polymers, or combinations thereof.

It is to be understood that global high temperatures (e.g., used for annealing, layer/nanowire growth, etc.) may degrade certain substrate materials, such as polymers. As such, when such materials are used for the substrate 14, it may be desirable to use localized heating (e.g., using a laser source) to provide heat for annealing and/or for semiconductor material, microcrystalline and/or nanowire 16, growth. In some instances, scanning of the laser spot may be used to provide localized heating to a larger area.

The metal material/layer 12 may be established to have any desirable configuration, and in this embodiment, the material/layer 12 has multiple peaks between which the nanowire 16 (FIG. 2B) may be formed. Non-limiting examples of suitable metals include platinum, titanium, tungsten, nickel, cobalt or any suitable alkaline metal for forming, for example, silicide or another highly conductive microcrystalline layer. The metal material/layer 12 may be established via any suitable deposition technique, including, but not limited to sputtering, evaporation, chemical vapor deposition, or the like.

Generally, the metal material/layer 12 may be established to have any desirable thickness, and the thickness may vary along the length of the established material/layer 12. It is to be understood that, in some embodiments, the metal material/layer 12 is thick enough to provide sufficient conductivity to the resulting conductive microcrystalline layer 18 (FIG. 2B). As a non-limiting example, the metal material/layer 12 thickness ranges from about 10 nm to about 100 nm.

A microcrystalline material/layer 20 is established on at least a portion of the metal material/layer 12. The microcrystalline material/layer 20 may be formed of microcrystalline silicon, microcrystalline germanium or alloys thereof. It is to be understood that the microcrystalline material/layer 20 may be undoped or may be lightly doped with p-type conductivity or n-type conductivity. Generally (as described further hereinbelow), the microcrystalline material/layer 20 reacts with the metal material/layer 12 to form the highly conductive microcrystalline layer 18 (non-limiting examples of which include a silicide or a germanide (e.g., platinum silicide and/or platinum germanide)). As a result of this reaction, either the undoped or the lightly doped microcrystalline material/layer 20 becomes highly conductive.

The microcrystalline material/layer 20 may be established via any suitable technique (e.g., plasma enhanced chemical vapor deposition (PECVD)), and to any desirable thickness (generally ranging from about 10 nm to about 10,000 nm). It is to be understood that if it is desirable to convert the entire thickness of an undoped microcrystalline material/layer 20 to a highly conductive microcrystalline, the thickness of the material/layer 20 may be relatively thin. In an embodiment, the thickness of the metal material/layer 12 ranges from about 10 nm to about 1000 nm, and the thickness of the microcrystalline material/layer 20 ranges from about 10 nm to about 10,000 nm. It is to be understood that thickness of the respective material/layers 12, 20 may vary depending, at least in part, on whether the microcrystalline material/layer 20 is lightly doped or undoped, on whether it is desirable to convert the entire microcrystalline material/layer 20, on how conductive the resulting microcrystalline layer 18 is desired to be, or the like, or combinations thereof. In one non-limiting example, the metal material/layer 12 is about 100 nm thick and the microcrystalline material/layer 20 is about 500 nm thick.

As shown in FIG. 2A, a catalyst nanoparticle 22 may be established on one of the microcrystalline material/layers 20. In one embodiment, the catalyst nanoparticle 22 is formed by depositing (on the microcrystalline material/layer 20) material(s) that subsequently form the catalyst nanoparticle 22 (e.g., upon exposure to heating). In another embodiment, a pre-formed catalyst nanoparticle 22 is deposited on the microcrystalline material/layer 20. In either embodiment, suitable deposition processes include, but are not limited to physical deposition processes, solution deposition processes, chemical deposition processes, electrochemical deposition processes, and/or combinations thereof.

Non-limiting examples of suitable catalyst nanoparticle materials include gold, titanium, platinum, palladium, gallium, nickel, or combinations thereof.

Nanowire 16 growth may be initiated via the catalyst nanoparticle 22 and a precursor gas. It is to be understood that in this embodiment, the nanowire 16 growth conditions (e.g., temperature) are suitable to initiate a reaction between the metal material/layer 12 and the microcrystalline material/layer 20, thereby forming the highly conductive microcrystalline layer 18. In this embodiment, the metal material/layer 12 thickness is sufficient to completely convert the microcrystalline material/layer 20 to a highly conductive microcrystalline layer 18. Since the metal material/layer 12 combines with the microcrystalline material/layer 20, the resulting microcrystalline layer 18 becomes highly conductive due to electrons from the metal. As such, the highly conductive microcrystalline layer 18 is generally doped with n-type conductivity.

The composition of the resulting highly conductive microcrystalline layer 18 will depend, at least in part, on the metal and microcrystalline used, as well as the thickness of such materials/layers 12, 20. As non-limiting examples, the highly conductive microcrystalline layer 18 may be a silicide, germanide, or combinations of silicide and germanide.

Since the nanowire growth conditions form the highly conductive microcrystalline layer 18 in the embodiment shown in FIG. 2B, the growth of the nanowire 16 is initiated at one highly conductive microcrystalline layer 18 surface and a connection is formed at another highly conductive microcrystalline layer 18 surface. It is to be understood that one of the nanowire ends may attach to a different surface (i.e., other than a surface of the highly conductive microcrystalline layer 18), as long as growth is initiated from a highly conductive microcrystalline layer 18. Non-limiting examples of surfaces to which one nanowire end may attach include a highly conductive microcrystalline layer 18, a conductive oxide layer, a quartz layer, or layers thereof. In one non-limiting example, the peak to which the nanowire 16 attaches may have a layer of conductive oxide established thereon instead of a highly conductive microcrystalline layer 18.

As the nanowire 16 grows, it is doped at predetermined areas with a dopant that is capable of introducing different conductivity types to one or more of the nanowire segments $S_1$, $S_2$, $S_3$. The dopant is introduced with the precursor gas. Generally, at least two of the segments $S_1$, $S_2$, $S_3$ are doped differently, such that a bipolar nanowire 16 is formed. It is to be understood that at least one of the segments $S_1$, $S_2$, $S_3$ is doped p-type or n-type and at least one other of the segments $S_1$, $S_2$, $S_3$ is doped the other of n-type or p-type. In a non-limiting example, the nanowire 16 may include two differently doped segments $S_1$, $S_2$ (see, e.g., FIG. 4D), thereby forming a p-n or n-p nanowire 16. As previously mentioned, the nanowire 16 may also be grown to include multiple p-type and n-type segments (not shown) or to include an undoped intrinsic semiconductor region (see, e.g., FIGS. 2B and 3C).

Generally, the nanowire segments $S_1$, $S_2$, $S_3$ are selected from semiconductor materials. Non-limiting examples of such materials include silicon, germanium, indium phosphide, gallium arsenide, gallium nitride, or the like, or alloys thereof, or combinations thereof. Furthermore, dopants for introducing p-type conductivity into group IV semiconductors include, but are not limited to boron, other like elements, or combinations thereof; and dopants for introducing n-type conductivity into group IV semiconductors include, but are not limited to phosphorus, arsenic, antimony, other like elements, or combinations thereof. Different dopants may be suitable for group III-V materials, such as, for example silicon, carbon, zinc, or the like, or combinations thereof.

The first segment $S_1$ is grown until a desirable length is achieved. Generally, the first segment $S_1$ is doped such that it forms a desirable ohmic contact with the surface from which it is grown.

Once the first segment $S_1$ is grown to a desirable length, the method includes changing or removing the dopant concentration to form the second segment $S_2$ at the end of the first segment $S_1$. In the embodiment of FIG. 2B, the second segment $S_2$ is an undoped intrinsic semiconductor region. This segment $S_2$ is generally formed by removing the dopant(s) from the precursor gas and continuing growth of the nanowire 16.

For nanowires 16 including three or more segments $S_1$, $S_2$, $S_3$, once the second segment $S_2$ is grown to a desirable length, the method includes changing the dopant concentration or reintroducing another dopant concentration to form the third segment $S_3$ at the end of the second segment $S_2$. In the embodiment shown in FIG. 2B, the third segment $S_3$ is doped to introduce a conductivity type different than the conductivity type of the first segment $S_1$. Generally, the third segment $S_3$ is doped such that it forms a desirable ohmic contact with the surface to which it attaches.

It is to be understood that the segment $S_1$, $S_2$, $S_3$ labels (i.e., first, second, third) are merely used for illustrative purposes, and are not intended to limit any specific nanowire 16 to any particular segment $S_1$, $S_2$, $S_3$ orientation. For example, in some instances, the third segment $S_3$ may be the undoped intrinsic semiconductor region and thus positioned between two other nanowire segments $S_1$, $S_2$.

In FIG. 2B, the resulting nanowire 16 connects to another highly conductive microcrystalline layer 18 that is formed on an adjacent peak of the metal material/layer 12. While the nanowire shown in FIG. 2B is depicted as being substantially horizontally oriented between the peaks, it is to be understood that the nanowire(s) 16 grow relatively randomly from one surface to another. As such, the nanowires 16 may be oriented horizontally, vertically or at some random angle, depending, at least in part, on the type of device 10 to be formed and the orientation of the surface of the highly conductive microcrystalline layer 18 (which, in some instances, has randomly oriented micro-crystals) from which the nanowire 16 is grown.

Referring now to FIGS. 3A through 3C, an embodiment of forming another embodiment of the device 10' (shown in FIG. 3C) is depicted. In this embodiment, the microcrystalline material/layer 20 is established on at least a portion of the substrate 14, and the metal material/layer 12 is established on at least a portion of the microcrystalline material/layer 20. It is to be understood that the materials and methods described hereinabove for such materials/layers 12, 20 or substrates 14 may be used in any of the embodiments disclosed herein.

As shown in FIG. 3A, the microcrystalline material/layer 20 is configured with a gap 24, and the nanowire 16 may be grown to extend across the gap 24. It is to be understood that the microcrystalline material/layer 20 may be established on the substrate 14 in any desirable manner, including the peak configuration of the metal material/layer 12 shown in FIGS. 2A and 2B. Generally, the configuration of the microcrystalline material/layer 20 and the metal material/layer 12 depends, at least in part, on the desirable position of the nanowire 16.

When the metal material/layer 12 is established on the microcrystalline material/layer 20, it is to be understood that the method further involves an annealing step prior to establishing the catalyst nanoparticle 22 and forming the nanowire 16. Annealing initiates a reaction between the metal material/layer 12 and a portion of the underlying microcrystalline material/layer 20. This reaction results in the formation of the highly conductive microcrystalline layer 18 at the surface of and extending into a portion of the microcrystalline material/layer 20. It is to be understood that annealing temperatures may vary, depending, at least in part, on the thickness of the metal material/layer 12. As non-limiting examples, the annealing temperature may range from about 350° C. to about 550° C.

It is to be understood that the amount of the microcrystalline material/layer 20 that reacts with the metal material/layer 12 depends, at least in part, on the thickness of the metal material/layer 12. It is to be further understood that if an undoped microcrystalline material/layer 20 is used, and a portion of the material/layer 20 remains undoped or lightly doped after the reaction, the remaining undoped/lightly doped portion may be doped to exhibit a desirable high conductivity. This is further described in reference to FIGS. 4A through 4D below.

As shown in FIG. 3B, once the highly conductive microcrystalline layer 18 is formed, the catalyst nanoparticle 22 may be established thereon. Nanowire 16 growth may then be initiated via the catalyst nanoparticle 22 and a precursor gas.

FIG. 3C depicts the resulting nanowire 16. As shown, in this embodiment, the nanowire 16 is attached to two highly conductive microcrystalline layer 18 surfaces. As previously stated, it is to be understood that one of the nanowire ends may attach to a different surface (i.e., other than a surface of the highly conductive microcrystalline layer 18).

As the nanowire 16 grows, it is doped at predetermined areas with a dopant that is capable of introducing different conductivity types to one or more of the nanowire segments $S_1$, $S_2$, $S_3$. In this embodiment, the nanowire 16 includes a segment $S_1$ doped to have a first conductivity type, a segment $S_2$ of an undoped intrinsic semiconductor, and a segment $S_3$ doped to have a second conductivity type that is different than the first conductivity type. It is to be understood that the first and second conductivity types are selected from p-type and n-type. As such, the embodiment shown in FIG. 3C is a p-i-n or n-i-p nanowire 16. As previously described, the respective segments $S_1$, $S_2$, $S_3$ may be grown to any desirable length. As mentioned above in reference to FIGS. 2A and 2B, during growth of the undoped intrinsic semiconductor segment $S_2$, dopant(s) are removed from the precursor gas and the nanowire 16 is allowed to grow for a predetermined time before introducing another dopant.

As previously described, the nanowire(s) 16 grows in some random direction. FIG. 3C depicts the nanowire 16 angularly oriented across the gap 24.

FIGS. 4A through 4D depict still another embodiment of the method for forming another embodiment of the device 10" (see FIG. 4D). In this embodiment, the microcrystalline material/layer 20 is undoped and is established on at least a portion of the metal material/layer 12. While not shown in FIG. 4A, the metal material/layer 12 may be formed on a substrate 14, such as those previously described.

The materials/layers 12, 20 are subjected to annealing. In this embodiment, the undoped microcrystalline material/layer 20 has a thickness such that upon exposure to annealing, a portion of the undoped microcrystalline material/layer 20 remains an undoped or becomes a lightly doped microcrystalline portion 26, and another portion of the undoped microcrystalline material/layer 20 reacts with the metal material/layer 12 to form the highly conductive microcrystalline layer 18. Generally, the undoped or lightly doped microcrystalline portion 26 remains after annealing when the metal material/ layer 12 is not thick enough to react with the entire undoped microcrystalline material/layer 20. Since the reaction between the metal material/layer 12 and the undoped microcrystalline material/layer 20 initiates at the interface between the two materials/layer 12, 20, the portion of the undoped microcrystalline material/layer 20 directly adjacent the metal material/layer 12 is converted to the highly conductive microcrystalline layer 18. As such, when the undoped microcrystalline material/layer 20 is too thick and/or the metal material/layer 12 is too thin, the reaction proceeds through less than the entire thickness of the undoped microcrystalline material/layer 20 and at least the surface of the undoped microcrystalline material/layer 20 remains undoped or becomes lightly doped.

As it is desirable to grow the nanowire 16 from a highly conductive surface, this embodiment of the method further includes doping the undoped or lightly doped microcrystalline portion 26 to have p-type conductivity or n-type conductivity. The doped microcrystalline portion is labeled 28 in FIG. 4C. It is believed that by further doping the portion 26, any increase in resistivity (due to the undoped or lightly doped portion 26) is minimized or eliminated. The dopant used depends, at least in part, on the conductivity type of the segment $S_1$, $S_2$, $S_3$ of the nanowire 16 that will contact the doped microcrystalline portion 28.

While this embodiment of the method results in a nanowire growth surface that is conductive, it is to be understood that this embodiment of the highly conductive growth surface includes 1) a portion which is the result of the reaction between the metal material/layer 12 and the undoped microcrystalline layer 20 (i.e., highly conductive microcrystalline layer 18), and 2) another portion which is doped with the desirable conductivity type.

After the entire growth surface is composed of some form of a highly conductive microcrystalline material, the catalyst nanoparticle 22 may be established and the nanowire 16 growth may be initiated as previously described. FIG. 4D depicts an embodiment of the device 10" formed via this embodiment of the method. As shown, the nanowire 16 is doped twice during growth, resulting in two segments $S_1$, $S_2$ having different conductivity types (i.e., a p-n nanowire or an n-p nanowire).

Still another embodiment of the method of forming still another embodiment of the device 10''' is shown in FIGS. 5A through 5C. In this embodiment, a plurality of nanowires 16 is grown in random, somewhat vertical, directions between the highly conductive microcrystalline layer 18 and another layer 30.

It is to be understood that any of the embodiments disclosed hereinabove may include a plurality of nanowires 16.

FIG. 5A depicts the already formed highly conductive microcrystalline layer 18 and the already grown plurality of nanowires 16. It is to be understood that the layer 18 and nanowires 16 may be formed and grown using any of the embodiments disclosed hereinabove. In this embodiment, the metal material/layer 12 is established on the substrate 14, and the undoped microcrystalline material/layer 20 (not shown) is initially established on the metal material/layer 12.

As shown in FIG. 5A, the metal material/layer 12 is established on a substrate 14 having a conductive oxide layer 32 established thereon. A non-limiting example of such a conductive oxide layer 32 include indium tin oxide. Any of the embodiments disclosed herein may include such a conductive oxide layer 32.

In this embodiment of the method, a material 34 is established between the nanowires 16. The material 34 may be established such that it covers the nanowires 16 (as shown in FIG. 5B). In some instances, however, it may be desirable that the material 34 is established such that the nanowires 16 extend through the material 34, thereby forming an anti-reflection surface. Non-limiting examples of such materials 34 include, but are not limited to calcium fluoride, silicon nitride, silicon dioxide, silicon carbide, spin-on-glass and/or combinations thereof. Such a material 34 may be established via sputtering, chemical vapor deposition (CVD), evaporation, liquid drop and spinning (e.g., spin-on-glass), and/or the like. Material 34 may also serve as a passivation layer to the nanowires 16.

When the material 34 is established to cover the nanowires 16, it may be desirable to then etched back (e.g., via chemical mechanical planarization (CMP)) the material 34 such that a segment $S_1$ of each of the nanowires 16 is exposed. In this embodiment, the nanowires 16 may be substantially planar with a surface S of the material 34 (see FIG. 5C) or may be substantially non-planar with the surface S. If it is desirable, the other layer 30 may then be established on the material 34 and on the exposed nanowire segments $S_1$. Non-limiting examples of this other layer 30 include a highly conductive microcrystalline layer 18 (e.g., formed via the methods disclosed herein), a conductive oxide layer, a metallic ohmic layer, or layers thereof. It is to be further understood that this other layer 30 may also be attached to an additional substrate (not shown).

While several embodiments have been described in detail, it will be apparent to those skilled in the art that the disclosed embodiments may be modified. Therefore, the foregoing description is to be considered exemplary rather than limiting.

What is claimed is:

1. A nanostructure, comprising:
   a highly conductive microcrystalline layer including, within the layer, a microcrystalline material and a metal selected from platinum, tungsten, titanium, nickel, and cobalt, the highly conductive microcrystalline layer having a resistivity ranging from about 1 μohm/cm to about 100 μohms/cm;
   a bipolar nanowire having one end attached to the highly conductive microcrystalline layer; and
   an other layer attached to an other end of the bipolar nanowire.

2. The nanostructure as defined in claim 1 wherein the bipolar nanowire is randomly oriented between the highly conductive microcrystalline layer and the other layer.

3. The nanostructure as defined in claim 1 wherein the bipolar nanowire includes a first segment of a first conductivity type and a second segment of a second conductivity type that is different than the first conductivity type.

4. The nanostructure as defined in claim 3 wherein the bipolar nanowire further comprises a third segment positioned between the first and second segments, and wherein the third segment is an undoped intrinsic semiconductor region.

5. The nanostructure as defined in claim 3, further comprising a quantum well formed between the first and second segments of the bipolar nanowire.

6. The nanostructure as defined in claim 3 wherein the first conductivity type is p-type or n-type, and wherein the second conductivity type is an other of n-type or p-type.

7. The nanostructure as defined in claim 1, further comprising a plurality of bipolar nanowires positioned between the highly conductive microcrystalline layer and the other layer, wherein each of the plurality of bipolar nanowires includes a first segment of a first conductivity type and a second segment of a second conductivity type that is different than the first conductivity type.

8. The nanostructure as defined in claim 7, further comprising a material established between adjacent bipolar nanowires, wherein the material is selected from calcium fluoride, silicon nitride, silicon dioxide, silicon carbide, spin-on-glass, and combinations thereof.

9. The nanostructure as defined in claim 1, further comprising:
   a substrate upon which the highly conductive microcrystalline layer is established; and
   a conductive oxide layer established between the highly conductive microcrystalline layer and the substrate.

10. The nanostructure as defined in claim 1 wherein the highly conductive microcrystalline layer includes silicide, germanide, or alloys of silicon and germanium.

11. The nanostructure as defined in claim 1 wherein the other layer is selected from an other highly conductive microcrystalline layer, a conductive oxide layer, a metallic ohmic layer, a quartz layer, or layers thereof.

12. The nanostructure as defined in claim 1 wherein the bipolar nanowire is vertically or horizontally oriented between the highly conductive microcrystalline layer and the other layer.

13. The nanostructure as defined in claim 1 wherein the bipolar nanowire is formed from semiconductor materials selected from silicon, germanium, indium phosphide, gallium arsenide, gallium nitride, alloys thereof, and combinations thereof.

* * * * *